US012755786B2

(12) United States Patent
Chen et al.

(10) Patent No.: US 12,755,786 B2

(45) Date of Patent: Oct. 6, 2026

(54) METHOD AND APPARATUS FOR INITIALIZING RESISTIVE RANDOM ACCESS MEMORY AND ELECTRONIC DEVICE

(71) Applicant: XIAMEN INDUSTRIAL TECHNOLOGY RESEARCH INSTITUTE CO., LTD., Xiamen (CN)

(72) Inventors: Anqiao Chen, Xiamen (CN); Tingying Shen, Xiamen (CN); Taiwei Chiu, Xiamen (CN); Szu-Chun Kang, Xiamen (CN); Wuxin Li, Xiamen (CN); Jinmao Yan, Xiamen (CN); Enping Cheng, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 123 days.

(21) Appl. No.: 19/012,984

(22) Filed: Jan. 8, 2025

(65) Prior Publication Data

US 2025/0149088 A1 May 8, 2025

Related U.S. Application Data

(63) Continuation of application No. PCT/CN2024/098503, filed on Jun. 11, 2024.

(30) Foreign Application Priority Data

Jun. 29, 2023 (CN) ......................... 202310781608.1

(51) Int. Cl.
*G11C 13/00* (2006.01)

(52) U.S. Cl.
CPC ................................ *G11C 13/0097* (2013.01)

(58) Field of Classification Search
CPC ........... G11C 13/0097; G11C 13/0007; G11C 13/0064; G11C 13/0069; G11C 2013/0083; G11C 2013/0092; G11C 13/00
See application file for complete search history.

(56) References Cited

U.S. PATENT DOCUMENTS 9,135,975 B2 9/2015 Kim et al.
9,171,617 B1 10/2015 Park et al.
(Continued)

FOREIGN PATENT DOCUMENTS

CN 102129886 A 7/2011
CN 111145811 A 5/2020
(Continued)

*Primary Examiner* — Tuan D Nguyen

(74) *Attorney, Agent, or Firm* — Bayramoglu Law Offices LLC

(57) ABSTRACT

A method and apparatus for initializing an RRAM and an electronic device are provided. The method includes: inputting a plurality of pulses of a first voltage into an RRAM until memory cells in the RRAM transition from a high resistance state to a low resistance state; inputting a plurality of pulses of a second voltage, a third voltage . . . and an $N^{th}$ voltage into the RRAM, so that resistance values of the memory cells reach a corresponding preset value, respectively. Voltage values of the first voltage to the $N^{th}$ voltage gradually decrease. When a total number of input pulses of an $i^{th}$ voltage is greater than a second preset threshold and a resistance change rate is less than a rate threshold, a plurality of pulses of an increased $i^{th}$ voltage are input into the RRAM until the resistance values of the memory cells reach an $i^{th}$ preset value.

10 Claims, 5 Drawing Sheets

(56) References Cited

U.S. PATENT DOCUMENTS

| | | | |
|---|---|---|---|
| 2007/0115714 | A1 | 5/2007 | Matsushita |
| 2009/0285007 | A1 | 11/2009 | Majewski |
| 2014/0321196 | A1 | 10/2014 | Ikeda et al. |
| 2019/0392897 | A1 | 12/2019 | Lu et al. |
| 2020/0005866 | A1 | 1/2020 | Jain et al. |
| 2022/0254413 | A1 | 8/2022 | Han |

FOREIGN PATENT DOCUMENTS

| | | | |
|---|---|---|---|
| CN | 112863574 | A | 5/2021 |
| CN | 116741236 | A | 9/2023 |
| JP | 2007134512 | A | 5/2007 |

METHOD AND APPARATUS FOR INITIALIZING RESISTIVE RANDOM ACCESS MEMORY AND ELECTRONIC DEVICE

CROSS REFERENCE TO THE RELATED APPLICATIONS

The present application is a continuation application of International Application No. PCT/CN2024/098503, filed on Jun. 11, 2024, which is based upon and claims priority to Chinese Patent Application No. 202310781608.1, filed on Jun. 29, 2023, the entire contents of which are incorporated herein by reference.

TECHNICAL FIELD

The present application relates to the technical field of resistive random access memories, and in particular to a method and apparatus for initializing a resistive random access memory and an electronic device.

BACKGROUND

An initialization of a resistive random access memory (RRAM) mainly refers to the transition of the state of memory cells in the RRAM from a high resistance state to a low resistance state. At present, the RRAM is mainly quickly initialized by pulses with gradually increasing voltage and pulse width, and then precisely initialized by pulses with gradually decreasing voltage and pulse width. However, in this initialization method, for memory cells including transistors and resistive devices, the resistive devices obtain little energy due to the voltage division of the transistors in the phase of precise initialization using the gradually decreasing voltage and pulse width. The occurrence of migration and transition of oxygen ions at the interface in the resistive devices requires energy above a certain threshold. Therefore, some memory cells cannot be initialized. Moreover, for large-scale array memory cells, there is also a voltage division problem related to physical addresses, resulting in voltage loss at a far end of the same row or column. Therefore, in the precise initialization phase, when the pulses with gradually decreasing voltage and pulse width are used for initialization, the far-end memory cells obtain little energy and cannot be initialized. Furthermore, in the large-scale array memory cells, some memory cells are difficult to initialize. In the precise initialization phase, if the pulses with gradually decreasing voltage and pulse width are used for initialization, these memory cells that are difficult to initialize cannot be initialized due to insufficient energy. Therefore, how to improve the success rate of initializing the RRAM is an urgent problem to be solved.

SUMMARY

In view of this, embodiments of the present application provide a method and apparatus for initializing a resistive random access memory and an electronic device, in order to solve at least the above technical problems in the related art.

According to a first aspect of the present application, an embodiment of the present application provides a method for initializing a resistive random access memory, including:

inputting a plurality of pulses of a first voltage into the resistive random access memory until memory cells in the resistive random access memory transition from a high resistance state to a low resistance state;

inputting a plurality of pulses of a second voltage into the resistive random access memory until resistance values of the memory cells in the resistive random access memory reach a second preset value; where the second preset value is less than the resistance values of the memory cells when transitioning from the high resistance state to the low resistance state;

inputting a plurality of pulses of a third voltage into the resistive random access memory until the resistance values of the memory cells in the resistive random access memory reach a third preset value; where the third preset value is less than the second preset value;

and so on, inputting a plurality of pulses of an $N^{th}$ voltage into the resistive random access memory until the resistance values of the memory cells in the resistive random access memory reach an $N^{th}$ preset value; where N is greater than or equal to 3, voltage values of the first voltage, the second voltage, the third voltage . . . and the $N^{th}$ voltage gradually decrease, the $N^{th}$ preset value is less than an $(N-1)^{th}$ preset value, and the $N^{th}$ preset value is a target resistance value achieved to complete an initialization of the memory cells;

where inputting a plurality of pulses of an $i^{th}$ voltage into the resistive random access memory until the resistance values of the memory cells in the resistive random access memory reach an $i^{th}$ preset value includes: inputting the plurality of pulses of the $i^{th}$ voltage into the resistive random access memory; when a total number of the input pulses of the $i^{th}$ voltage is greater than a second preset threshold and a resistance change rate is less than a rate threshold, increasing the $i^{th}$ voltage to obtain an increased $i^{th}$ voltage, and inputting a plurality of pulses of the increased $i^{th}$ voltage into the resistive random access memory until the resistance values of the memory cells in the resistive random access memory reach the $i^{th}$ preset value; where i represents any of two, three . . . N−1, and N.

Optionally, the inputting the plurality of pulses of the first voltage into the resistive random access memory until the memory cells in the resistive random access memory transition from the high resistance state to the low resistance state may include:

obtaining first electrical parameters of the memory cells in the resistive random access memory; where the first electrical parameters may include at least one of first current values or first resistance values; and when it is determined based on the first electrical parameters that the memory cells in the resistive random access memory have not transitioned from the high resistance state to the low resistance state, inputting one pulse of the first voltage into the resistive random access memory; and then returning to the step of obtaining the first electrical parameters of the memory cells in the resistive random access memory until it is determined that the memory cells in the resistive random access memory have transitioned from the high resistance state to the low resistance state.

Optionally, the inputting one pulse of the first voltage into the resistive random access memory when it is determined based on the first electrical parameters that the resistive random access memory have not transitioned from the high resistance state to the low resistance state may include:

when a total number of the input pulses of the first voltage is less than a first preset threshold and it is determined based on the first electrical parameters that the memory cells in the resistive random access memory have not transitioned from the high resistance state to the low resistance state, inputting one pulse of the first voltage into the resistive random access memory.

Optionally, the inputting the plurality of pulses of the $i^{th}$ voltage into the resistive random access memory may include:

obtaining $i^{th}$ electrical parameters of the memory cells in the resistive random access memory; where the $i^{th}$ electrical parameters may include at least one of $i^{th}$ current values or $i^{th}$ resistance values; and when it is determined based on the $i^{th}$ electrical parameters that the resistance values of the memory cells in the resistive random access memory do not reach the $i^{th}$ preset value, inputting one pulse of the $i^{th}$ voltage into the resistive random access memory; and then returning to the step of obtaining the $i^{th}$ electrical parameters of the memory cells in the resistive random access memory.

Optionally, the inputting one pulse of the $i^{th}$ voltage into the resistive random access memory when it is determined based on the $i^{th}$ electrical parameters that the resistance values of the memory cells in the resistive random access memory do not reach the $i^{th}$ preset value may include:

when the total number of the input pulses of the $i^{th}$ voltage is less than the second preset threshold, a total number of the input pulses is less than a third preset threshold, and it is determined based on the $i^{th}$ electrical parameters that the resistance values of the memory cells in the resistive random access memory do not reach the $i^{th}$ preset value, inputting one pulse of the $i^{th}$ voltage into the resistive random access memory.

Optionally, when the total number of the input pulses of the $i^{th}$ voltage is greater than the second preset threshold and the resistance change rate is less than the rate threshold, the increasing the $i^{th}$ voltage and inputting the plurality of pulses of the increased $i^{th}$ voltage into the resistive random access memory until the resistance values of the memory cells in the resistive random access memory reach the $i^{th}$ preset value may include:

when the total number of the input pulses of the $i^{th}$ voltage is greater than the second preset threshold, a total number of the input pulses is less than a third preset threshold, and the resistance change rate is less than the rate threshold, inputting the plurality of pulses of the increased $i^{th}$ voltage into the resistive random access memory until the resistance values of the memory cells in the resistive random access memory reach the $i^{th}$ preset value.

Optionally, a formula for calculating the resistance change rate may be as follows:

where $\Delta\sigma$ may represent the $$\frac{(I_2 - I_1)}{V} = \Delta\sigma,$$

$I_2$ may represent a current value when the total number of the input pulses of the $i^{th}$ voltage is the second preset threshold, $I_1$ may represent a current value when the total number of the input pulses of the $i^{th}$ voltage is 1, and V may represent a voltage value of the $i^{th}$ voltage.

According to a second aspect of the present application, an embodiment of the present application provides an apparatus for initializing a resistive random access memory, including:

a first input unit, configured to input a plurality of pulses of a first voltage into the resistive random access memory until memory cells in the resistive random access memory transition from a high resistance state to a low resistance state;

a second input unit, configured to input a plurality of pulses of a second voltage into the resistive random access memory until resistance values of the memory cells in the resistive random access memory reach a second preset value; where the second preset value is less than the resistance values of the memory cells when transitioning from the high resistance state to the low resistance state;

a third input unit, configured to input a plurality of pulses of a third voltage into the resistive random access memory until the resistance values of the memory cells in the resistive random access memory reach a third preset value; where the third preset value is less than the second preset value;

and so on, until an $N^{th}$ input unit, configured to input a plurality of pulses of an $N^{th}$ voltage into the resistive random access memory until the resistance values of the memory cells in the resistive random access memory reach an $N^{th}$ preset value; wherein N is greater than or equal to 3, voltage values of the first voltage, the second voltage, the third voltage . . . and the $N^{th}$ voltage gradually decrease, the $N^{th}$ preset value is less than an $(N-1)^{th}$ preset value, and the $N^{th}$ preset value is a target resistance value achieved to complete an initialization of the memory cells;

where inputting a plurality of pulses of an $i^{th}$ voltage into the resistive random access memory until the resistance values of the memory cells in the resistive random access memory reach an $i^{th}$ preset value includes: inputting the plurality of pulses of the $i^{th}$ voltage into the resistive random access memory; when a total number of the input pulses of the $i^{th}$ voltage is greater than a second preset threshold and a resistance change rate is less than a rate threshold, increasing the $i^{th}$ voltage to obtain an increased $i^{th}$ voltage, and inputting a plurality of pulses of the increased $i^{th}$ voltage into the resistive random access memory until the resistance values of the memory cells in the resistive random access memory reach the $i^{th}$ preset value; where i represents any of two, three . . . N−1, and N.

According to a third aspect of the present application, an embodiment of the present application provides an electronic device, including:

at least one processor; and a memory in communication connection with the at least one processor, where the memory stores instructions executable by the at least one processor, and the instructions are executed by the at least one processor to cause the at least one processor to execute the method for initializing a resistive random access memory according to the first aspect or any implementation of the first aspect.

According to a fourth aspect of the present application, an embodiment of the present application provides a non-transitory computer-readable storage medium, where computer instructions are stored in the non-transitory computer-readable storage medium and configured to, when executed by a computer, cause the computer to perform the method for initializing a resistive random access memory according to the first aspect or any implementation of the first aspect.

According to the method and apparatus for initializing the resistive random access memory and the electronic device provided in the embodiments of the present application, the resistive random access memory is first initialized by a plurality of pulses of a relatively high voltage, so that the memory cells in the resistive random access memory can quickly transition from a high resistance state to a low resistance state; then, after the memory cells in the resistive random access memory transition to the low resistance state, the resistance values of the memory cells are finely tuned in a plurality of phases, and the voltages of the pulses in each phase are the same, which can converge the initialized resistance state distribution and improve the consistency between cells in the array. Moreover, during each phase of fine-tuning, if the total number of pulses input in that phase is greater than the second preset threshold and the resistance change rate is less than the rate threshold, the voltage in that phase is increased, and a plurality of pulses of the increased voltage are input to the resistive random access memory until the resistance values of the memory cells in the resistive random access memory reach a target of that phase, which can further prevent some memory cells from being unable to obtain sufficient energy to complete initialization due to voltage division by transistors and voltage division related to physical addresses, and can also prevent the memory cells that are difficult to initialize from being unable to complete initialization due to insufficient energy, thereby greatly improving the success rate of initialization of the memory cells.

The above description is merely an overview for the technical solutions of the present application. In order to have a clearer understanding for the technical means of the present application to implement in accordance with the contents of the specification, and in order to make the above and other purposes, features and advantages of the present application more obvious and understandable, specific implementations of the present application are specially described below.

DETAILED DESCRIPTION OF THE EMBODIMENTS

In order to make the objectives, technical solutions and advantages of embodiments of the present application clearer, the technical solutions in the embodiments of the present application will be described clearly and completely below in conjunction with the accompanying drawings in the embodiments of the present application. Apparently, the described embodiments are merely a part rather than all of the embodiments of the present application. All other embodiments obtained by those skilled in the art without creative efforts based on the embodiments of the present application shall fall within the protection scope of the present application.

Figure 1:
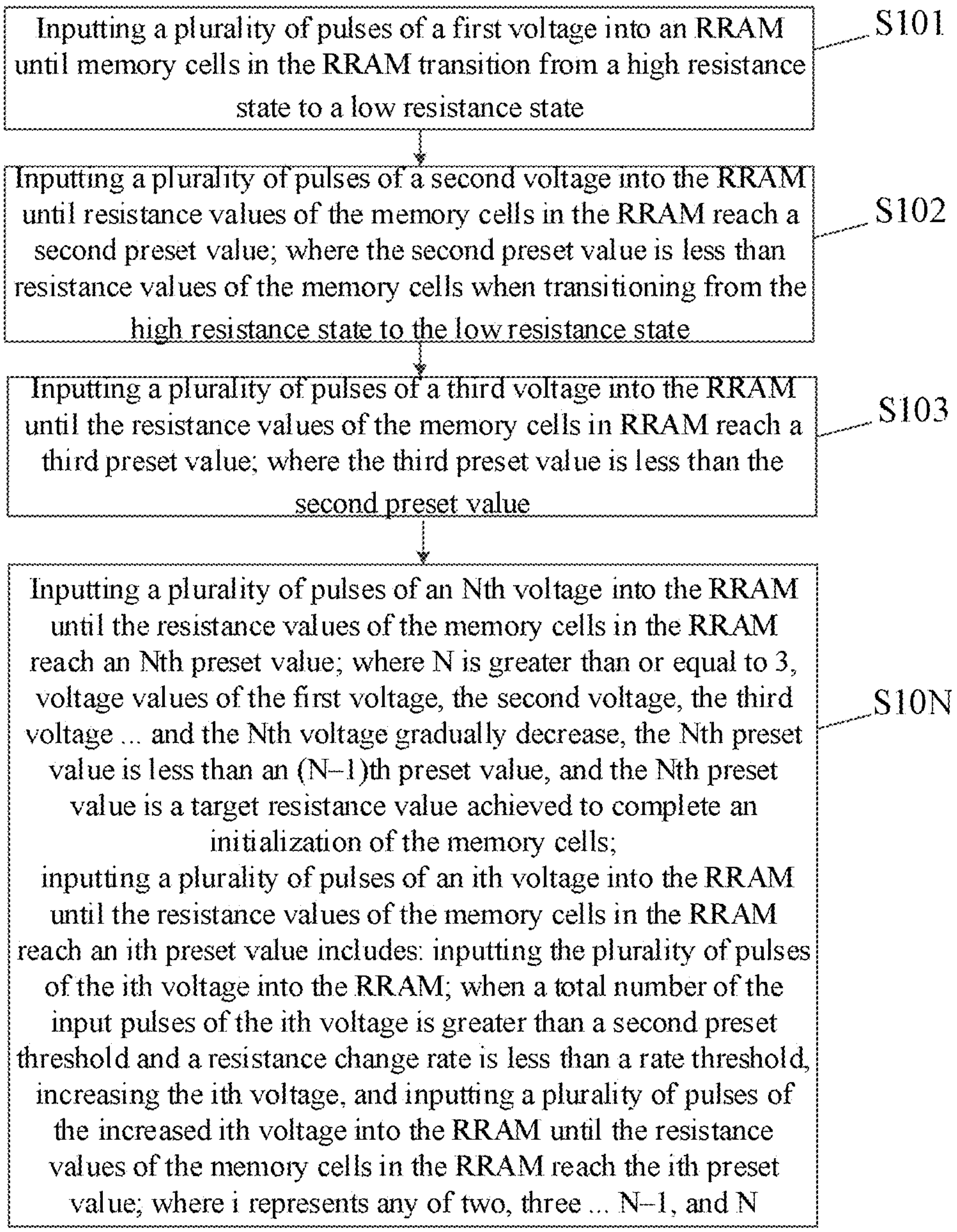
FIG. 1 is a flowchart of a method for initializing a resistive random access memory in an embodiment of the present application.

An embodiment of the present application provides a method for initializing a resistive random access memory, as shown in FIG. 1, which includes:

S101, inputting a plurality of pulses of/at a first voltage into a resistive random access memory until memory cells in the resistive random access memory transition from a high resistance state to a low resistance state.

In the embodiment, the transition in the resistance state of the memory cells in the resistive random access memory is related to the energy accumulation of current flowing through. As the energy accumulation of the current breaks through a critical value, its resistance value changes drastically. The drastic change process is a process of transition of the memory cells from the high resistance state to the low resistance state, that is, a process of forming conductive channels of the resistive random access memory.

Figure 2:
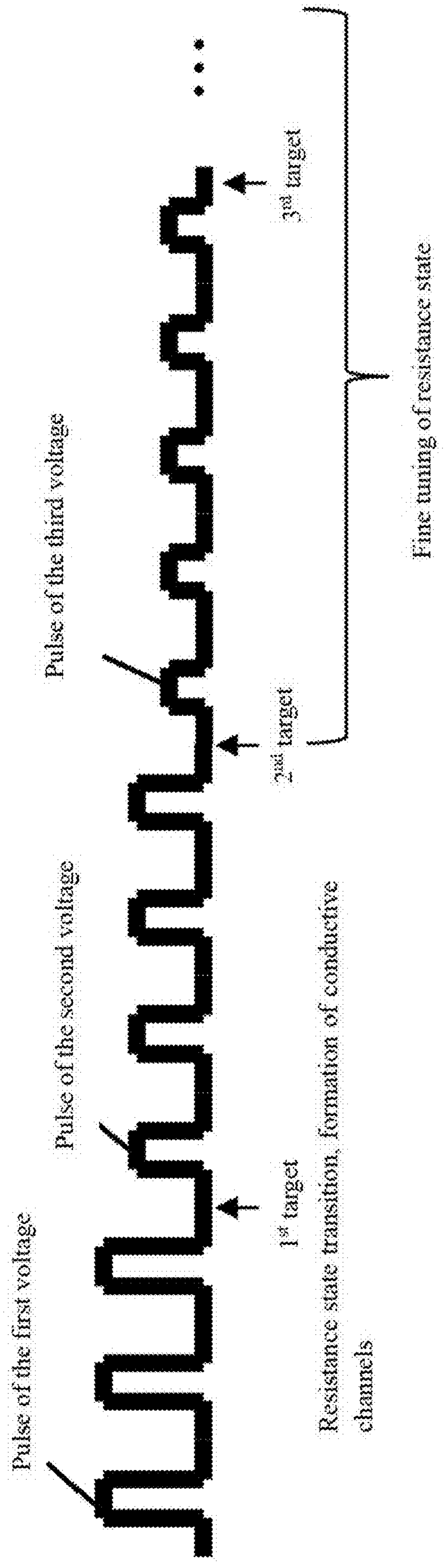
FIG. 2 is a schematic diagram of pulses input into a resistive random access memory in phases in an embodiment of the present application.

In the embodiment, as shown in FIG. 2, the pulses of the first voltage can be input into the resistive random access memory one by one in a first phase until a target resistance value or target voltage value ($1^{st}$ target) set in the first phase is reached, that is, the memory cells in the resistive random access memory transition from the high resistance state to the low resistance state.

In one implementation, when each pulse of the first voltage is input into the resistive random access memory, current values of the memory cells are detected by current measuring instrument(s), and then the detected current values are compared with a target current value to determine whether the memory cells in the resistive random access memory transition from the high resistance state to the low resistance state. The target current value can be determined by multiple tests, and the target current value is used for representing the transition of the memory cells in resistive random access memory from the high resistance state to the low resistance state. If it is determined that the memory cells in the resistive random access memory transition from the high resistance state to the low resistance state, the input of the pulses of the first voltage is stopped. If it is determined that the memory cells in the resistive random access memory do not transition from the high resistance state to the low resistance state, the input of the pulses of the first voltage is continued.

In another implementation, when each pulse of the first voltage is input into the resistive random access memory, resistance values of the memory cells are detected by resistance measuring instrument(s), and then the detected resistance values are compared with a target resistance value to determine whether the memory cells in the resistive random access memory transition from the high resistance state to the low resistance state. The target resistance value can be determined by multiple tests, and the target resistance value is used for representing the transition of the memory cells in resistive random access memory from the high resistance state to the low resistance state. If it is determined that the memory cells in the resistive random access memory transition from the high resistance state to the low resistance state, the input of the pulses of the first voltage is stopped. If it is determined that the memory cells in the resistive random access memory do not transition from the high resistance state to the low resistance state, the input of the pulses of the first voltage is continued.

S102, a plurality of pulses of a second voltage are input into the resistive random access memory until resistance values of the memory cells in the resistive random access memory reach a second preset value, and the second preset value is less than resistance values of the memory cells when transitioning from the high resistance state to the low resistance state.

In the embodiment, after the memory cells transition from the high resistance state to the low resistance state, the specific resistance values of the memory cells need to be controlled, that is, the resistance values of the memory cells are enabled to reach a first preset value. This process can be called a resistance state fine-tuning process, that is, a fine-tuning process of the resistance values of the memory cells.

In the embodiment, a plurality of phased targets are set in the resistance state fine-tuning process, so that the resistance state fine-tuning can be divided into a plurality of phases to facilitate the convergence of the resistance state of the memory cells. In each phase of fine-tuning, the energy of the pulses is kept unchanged to prevent the resistance state of the memory cells from being unchanged or changing slowly due to insufficient accumulated energy, which takes a lot of operation time and cannot achieve the effect of resistance state convergence.

Figure 3:
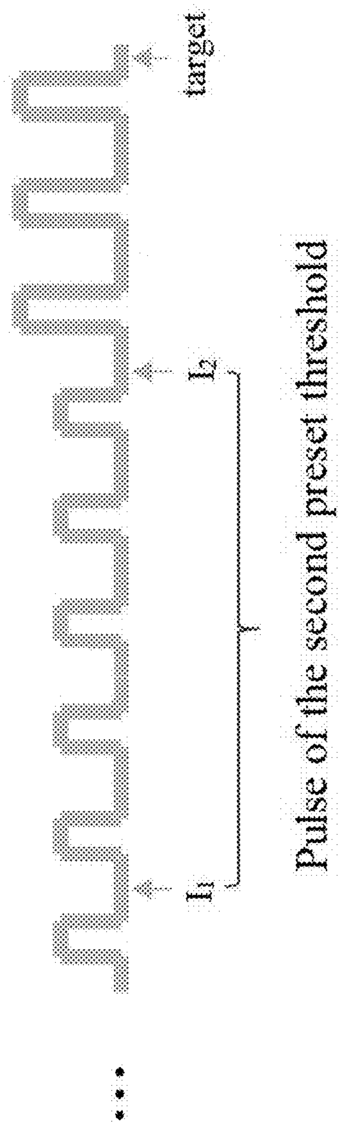
FIG. 3 is a schematic diagram of improving a success rate of resistance state convergence by increasing pulse energy in an embodiment of the present application.

During specific implementation, as shown in FIG. 2, a plurality of fine-tuning phases can be set when the resistance values of the memory cells are finely tuned. That is, the resistance values when the resistance state of the memory cells transitions are finely tuned to the target resistance value that needs to be achieved to complete the initialization of the memory cells in a plurality of fine-tuning phases, each fine-tuning phase corresponds to a resistance value to be achieved ($2^{nd}$ target, $3^{rd}$ target . . . ), and as the fine-tuning phase increases, the resistance value to be achieved is smaller, and the target of the last fine-tuning phase is the target resistance value. Then, for the first fine-tuning phase, the plurality of pulses of the second voltage are input into the resistive random access memory. If the total number of the input pulses of the second voltage is greater than a second preset threshold and the resistance change rate is less than a rate threshold, the second voltage is increased, as shown in FIG. 3. A plurality of pulses of the increased second voltage are input into the resistive random access memory until the resistance values of the memory cells in the resistive random access memory reach the second preset value.

A formula for calculating the resistance change rate is as follows:

$$\frac{(I_2 - I_1)}{V} = \Delta\sigma,$$

where $\Delta\sigma$ represents the resistance change rate, $I_2$ represents a current value when the total number of input pulses of an $i^{th}$ voltage is the second preset threshold, $I_1$ represents a current value when the total number of the input pulses of the $i^{th}$ voltage is 1, V represents a voltage value of the $i^{th}$ voltage, and i represents any of two, three . . . N−1, and N.

In the embodiment, after the pulse of the second voltage at the second preset threshold, if the resistance change rate of the memory cells is less than the rate threshold, increasing pulse energy can improve the success rate of initialization of the memory cells in the first fine-tuning phase and significantly reduce the fine-tuning time in the first fine-tuning phase.

S103, a plurality of pulses of a third voltage are input into the resistive random access memory until the resistance values of the memory cells in the resistive random access memory reach a third preset value, and the third preset value is less than the second preset value.

In the embodiment, the specific implementation process of step S103 can refer to step S102.

And so on, until S10N, a plurality of pulses of an $N^{th}$ voltage are input into the resistive random access memory until the resistance values of the memory cells in the resistive random access memory reach an $N^{th}$ preset value, and N is greater than or equal to 3. Voltage values of the first voltage, the second voltage, the third voltage . . . and the $N^{th}$ voltage gradually decrease, the $N^{th}$ preset value is less than an $(N-1)^{th}$ preset value, and the $N^{th}$ preset value is a target resistance value achieved to complete an initialization of the memory cells. Inputting a plurality of pulses of an $i^{th}$ voltage into the resistive random access memory until the resistance values of the memory cells in the resistive random access memory reach an $i^{th}$ preset value includes: inputting the plurality of pulses of the $i^{th}$ voltage into the resistive random access memory; when the total number of the input pulses of the $i^{th}$ voltage is greater than a second preset threshold and a resistance change rate is less than a rate threshold, increasing the $i^{th}$ voltage, and inputting a plurality of pulses of the increased $i^{th}$ voltage into the resistive random access memory until the resistance values of the memory cells in the resistive random access memory reach the $i^{th}$ preset value, where i represents any of two, three . . . N−1, and N.

In the embodiment, the specific implementation process of step S10N can refer to step S102.

Figure 4:
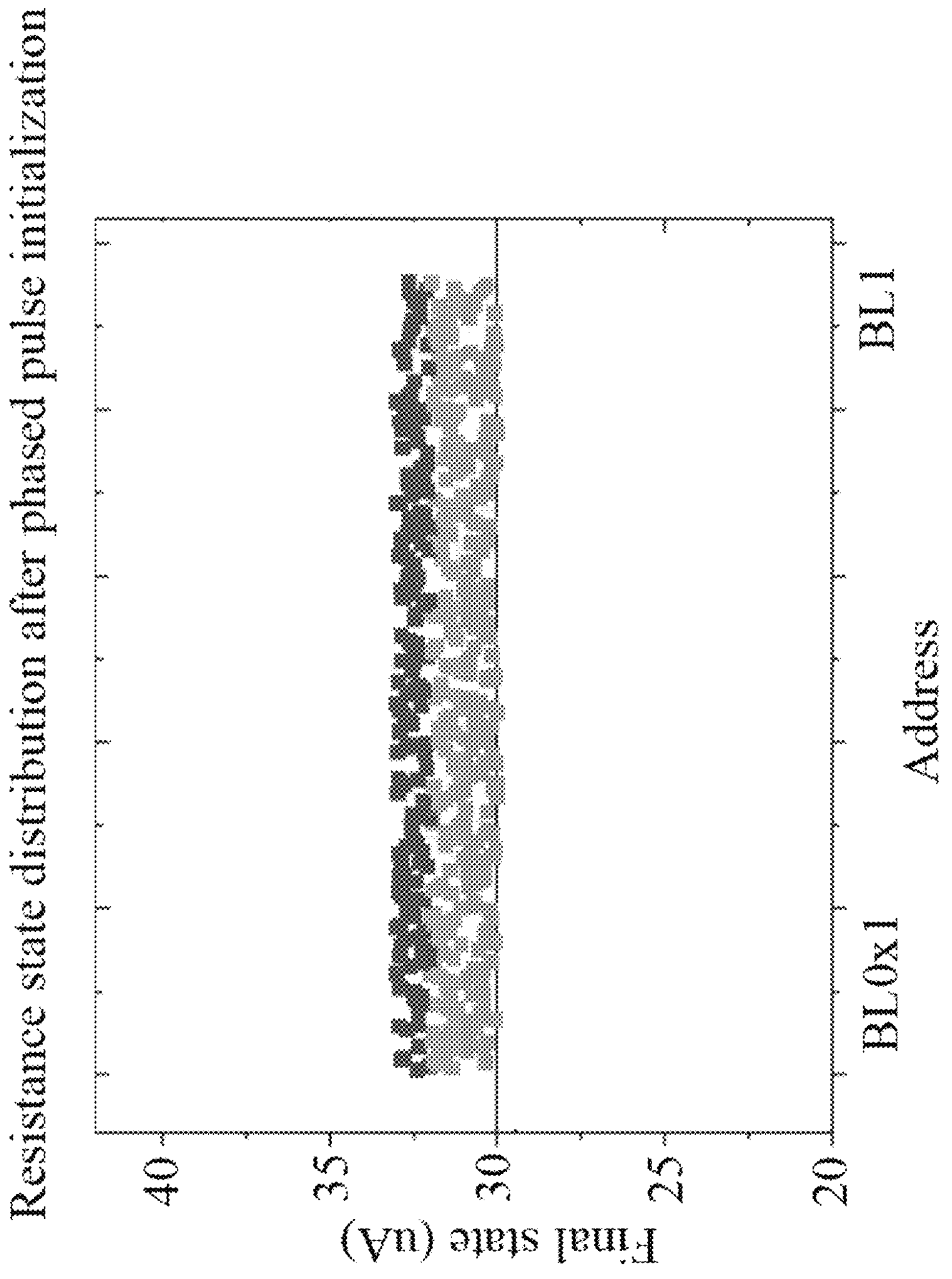
FIG. 4 is a schematic diagram showing comparison between resistance state ranges after equal-voltage pulse initialization and phased initialization in the present application.

In the embodiment, after the memory cells in the resistive random access memory transition to the low resistance state, the resistance values of the memory cells are finely tuned in a plurality of phases, and the closer the resistance values of the memory cells are to the first preset value, the lower the pulse voltage used, which can better converge the resistance values of the memory cells in the resistive random access memory during fine tuning and prevent an excessively wide range of the resistance values of the memory cells due to overshooting from affecting the subsequent working performance. As shown in FIG. 4, the resistive random access memory is initialized by gradually decreasing voltage pulses in phases in the present application, so that the resistance values of the memory cells in the resistive random access memory can converge well, and the range of the resistance values is relatively narrow after initialization.

Figure 5:
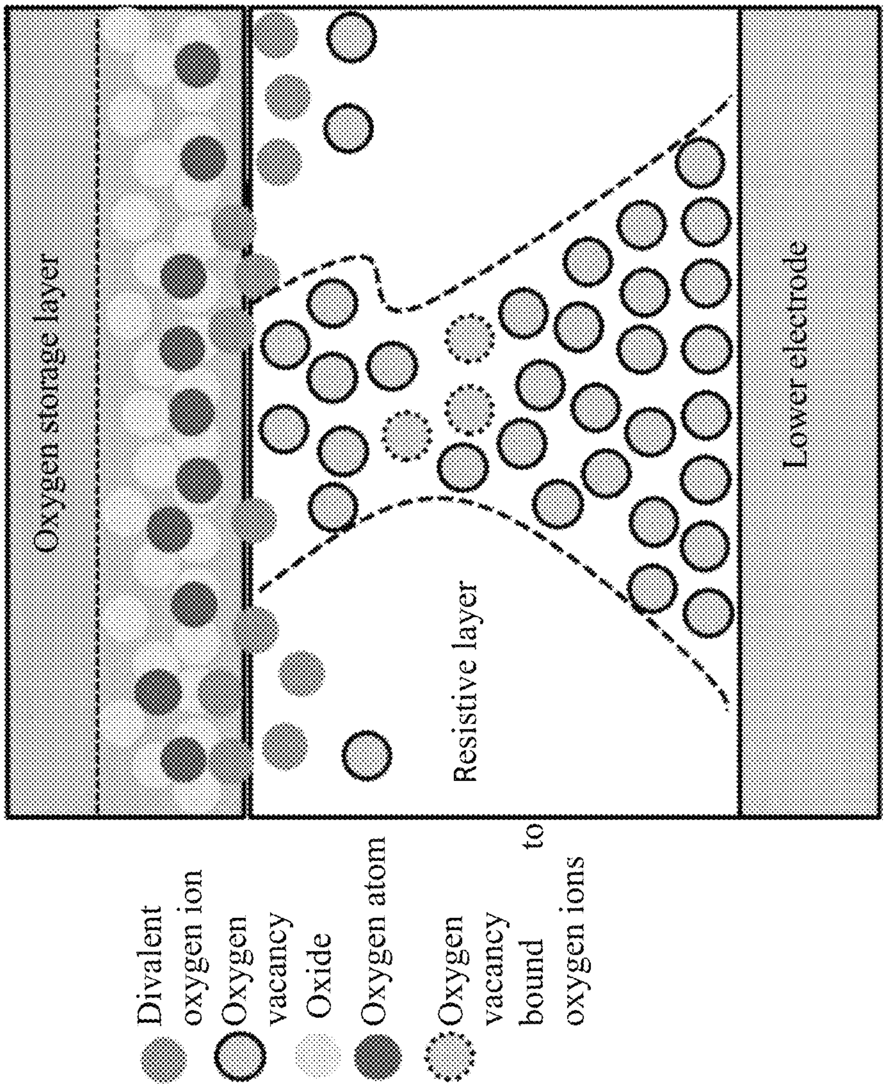
FIG. 5 is a schematic diagram showing comparison between oxygen vacancies and $O^{2-}$ concentrations around conductive filaments after equal-voltage pulse initialization and phased initialization in the present application.

In the embodiment, after the memory cells in the resistive random access memory transition to the low resistance state, the resistance values of the memory cells are finely tuned in phases, and the closer the resistance values of the memory cells are to the first preset value, the lower the pulse voltage used, which can reduce oxygen vacancies and $O^{2-}$ concentration around conductive filaments and reduce the probability of recombination of $O^{2-}$ with the oxygen vacancies that form the conductive filaments or diffusion of free oxygen vacancies into conductive channels, thereby improving the data retention performance of the memory cells. As shown in FIG. 5, the phased initialization of the resistive random access memory by voltage pulses in the present application shows fewer oxygen vacancies and lower $O^{2-}$ concentration around the conductive filaments.

According to the method for initializing the resistive random access memory provided in the embodiments of the present application, the resistive random access memory is first initialized by a plurality of pulses of a relatively high voltage, so that the memory cells in the resistive random access memory can quickly transition from a high resistance state to a low resistance state; then, after the memory cells in the resistive random access memory transition to the low resistance state, the resistance values of the memory cells are finely tuned in a plurality of phases, which can converge the initialized resistance state distribution and improve the consistency between cells in the array. Moreover, during each phase of fine-tuning, if the total number of pulses input in that phase is greater than the second preset threshold and the resistance change rate is less than the rate threshold, the voltage in that phase is increased, and a plurality of pulses of the increased voltage are input to the resistive random access memory until the resistance values of the memory cells in the resistive random access memory reach a target of that phase, which can further prevent some memory cells from being unable to obtain sufficient energy to complete initialization due to voltage division by transistors and voltage division related to physical addresses, and can also prevent the memory cells that are difficult to initialize from being unable to complete initialization due to insufficient energy, thereby greatly improving the success rate of initialization of the memory cells.

In an optional embodiment, the step S101 of inputting the plurality of pulses of the first voltage into the resistive random access memory until the memory cells in the resistive random access memory transition from the high resistance state to the low resistance state includes:

S1011, obtaining first electrical parameters of the memory cells in the resistive random access memory, the first electrical parameters including at least one of first current values or first resistance values; and

S1012, when it is determined based on the first electrical parameters that the memory cells in the resistive random access memory have not transitioned from the high resistance state to the low resistance state, inputting one pulse of the first voltage into the resistive random access memory; and then returning to the step of obtaining the first electrical parameters of the memory cells in the resistive random access memory until it is determined that the memory cells in the resistive random access memory have transitioned from the high resistance state to the low resistance state.

In the embodiment, for step S1011, when the initialization process starts, the first current values or first resistance values of the memory cells in the resistive random access memory can be obtained. The first current values of the memory cells in the resistive random access memory can be measured by current measuring instruments, and the first resistance values of the memory cells in the resistive random access memory can be measured by resistance measuring instruments.

In the embodiment, for step S1012, when determining whether the memory cells in the resistive random access memory have transitioned from the high resistance state to the low resistance state based on the first electrical parameters, the first electrical parameters can be compared with the target resistance value or the target voltage value. If the first electrical parameters reach the target resistance value or the target voltage value, it is determined that the memory cells have transitioned from the high resistance state to the low resistance state. Otherwise, it is determined that the memory cells have not transitioned from the high resistance state to the low resistance state. If the memory cells have not transitioned from the high resistance state to the low resistance state, the pulses of the first voltage are repeatedly output multiple times.

In one implementation, for step S1012, considering the duration of initialization, that is, in order to ensure the efficiency of initialization, before one pulse of the first voltage continues to be input into the resistive random access memory, the total number of the input pulses of the first voltage can also be considered. If the total number of the input pulses of the first voltage is greater than a first preset threshold, initialization failure can be prompted. If the total number of the input pulses of the first voltage is less than the first preset threshold and it is determined based on the first electrical parameters that the memory cells in the resistive random access memory have not transitioned from the high resistance state to the low resistance state, one pulse of the first voltage is input into the resistive random access memory. Therefore, in step S1012, when it is determined based on the first electrical parameters that the resistive random access memory has not transitioned from the high resistance state to the low resistance state, the inputting one pulse of the first voltage into the resistive random access memory may include: when a total number of the input pulses of the first voltage is less than a first preset threshold and it is determined based on the first electrical parameters that the memory cells in the resistive random access memory have not transitioned from the high resistance state to the low resistance state, one pulse of the first voltage is input to the resistive random access memory; and if the total number of the input pulses of the first voltage is greater than the first preset threshold, initialization failure information is prompted.

In the embodiment, by inputting the pulses of the first voltage one by one into the memory cells in the resistive random access memory and determining based on the first electrical parameters whether the memory cells in the resistive random access memory have transitioned from the high resistance state to the low resistance state in real time, the memory cells can quickly transition from the high resistance state to the low resistance state without overshooting.

In an optional embodiment, the inputting the plurality of pulses of the $i^{th}$ voltage into the resistive random access memory includes:

obtaining $i^{th}$ electrical parameters of the memory cells in the resistive random access memory, the $i^{th}$ electrical parameters including at least one of $i^{th}$ current values or $i^{th}$ resistance values; when it is determined based on the $i^{th}$ electrical parameters that the resistance values of the memory cells in the resistive random access memory do not reach the $i^{th}$ preset value, inputting one pulse of the $i^{th}$ voltage into the resistive random access memory; and then returning to the step of obtaining the $i^{th}$ electrical parameters of the memory cells in the resistive random access memory.

In one implementation, considering the duration of initialization, that is, in order to ensure the efficiency of initialization, before one pulse of the $i^{th}$ voltage is input into the resistive random access memory, the total number of the input pulses in the resistance state fine-tuning phase and the total number of the input pulses of the $i^{th}$ voltage in the current phase can also be considered. If the total number of the input pulses in the resistance state fine-tuning phase is greater than a third preset threshold, or the total number of the input pulses of the $i^{th}$ voltage is greater than the second preset threshold, then initialization failure information is directly prompted. If the total number of the input pulses in the resistance state fine-tuning phase is less than the third preset threshold, the total number of the input pulses of the $i^{th}$ voltage is less than the second preset threshold, and it is determined based on the $i^{th}$ electrical parameters that the resistance values of the memory cells in the resistive random access memory do not reach the $i^{th}$ preset value, then one pulse of the second voltage is input into the resistive random access memory.

Therefore, when it is determined based on the $i^{th}$ electrical parameters that the resistance values of the memory cells in the resistive random access memory do not reach the $i^{th}$ preset value, the inputting one pulse of the $i^{th}$ voltage into the resistive random access memory may include: when the total number of the input pulses of the $i^{th}$ voltage is less than the second preset threshold, a total number of the input pulses is less than a third preset threshold, and it is determined based on the $i^{th}$ electrical parameters that the resistance values of the memory cells in the resistive random access memory do not reach the $i^{th}$ preset value, then one pulse of the $i^{th}$ voltage is input into the resistive random access memory.

In the embodiment, an overshooting phenomenon can be avoided by inputting the pulses of the $i^{th}$ voltage one by one into the memory cells in the resistive random access memory and determining based on the $i^{th}$ electrical parameters whether the memory cells in the resistive random access memory have completed a target in an $i^{th}$ phase in real time.

In an optional embodiment, when the total number of the input pulses of the $i^{th}$ voltage is greater than the second preset threshold and the resistance change rate is less than the rate threshold, the increasing the $i^{th}$ voltage and inputting the plurality of pulses of the increased $i^{th}$ voltage into the resistive random access memory until the resistance values of the memory cells in the resistive random access memory reach the $i^{th}$ preset value includes:

when the total number of the input pulses of the $i^{th}$ voltage is greater than the second preset threshold, a total number of the input pulses is less than a third preset threshold, and the resistance change rate is less than the rate threshold, then the plurality of pulses of the increased $i^{th}$ voltage are input into the resistive random access memory until the resistance values of the memory cells in the resistive random access memory reach the $i^{th}$ preset value.

In the embodiment, for some memory cells whose resistance states are difficult to converge, when the pulses of the $i^{th}$ voltage of the second preset threshold are input into the resistive random access memory and these memory cells still cannot achieve the phased target, in order to successfully complete initialization, meet the requirements of resistance state convergence, and improve the efficiency of resistance state convergence, that is, balance the efficiency and success rate of initialization, it can be considered to input pulses with stronger energy into the resistive random access memory when the total number of the input pulses in the resistance state fine-tuning phase is less than the third preset threshold, the total number of the input pulses of the $i^{th}$ voltage is greater than the second preset threshold, and the resistance change rate is less than the rate threshold.

During specific implementation, in an initial phase of resistance state fine-tuning, a voltage acceleration coefficient can be set to 1 and then multiplied by the $i^{th}$ voltage to obtain a voltage value of the $i^{th}$ voltage, and the $i^{th}$ voltage corresponding to the voltage value is input into the resistive random access memory. If the total number of the input pulses of the $i^{th}$ voltage is greater than the second preset threshold and the total number of the input pulses is less than the third preset threshold, the total number of the input pulses of the $i^{th}$ voltage is set to 0. And the resistance change rate is calculated based on a calculation formula. The calculation formula is as follows:

$$\frac{(I_2 - I_1)}{V} = \Delta\sigma,$$

where $\Delta\sigma$ represents the resistance change rate, $I_2$ represents a current value when the total number of the input pulses of an $i^{th}$ voltage is the second preset threshold, $I_1$ represents a current value when the total number of the input pulses of the $i^{th}$ voltage is 1, and V represents a voltage value of the $i^{th}$ voltage.

Then, the magnitudes of the resistance change rate and the rate threshold are determined. If the resistance change rate is less than the rate threshold, the predetermined voltage acceleration coefficient is updated based on a preset formula. The preset formula is: $\beta=\beta 1*(1+x\ \%)$, where $\beta$ represents a new voltage acceleration coefficient, $\beta 1$ represents the originally set voltage acceleration coefficient, and x represents a preset value. The updated voltage acceleration coefficient is multiplied by the $i^{th}$ voltage to obtain the voltage value of the $i^{th}$ voltage, and the $i^{th}$ voltage corresponding to the voltage value is input into the resistive random access memory until it is determined that the resistance values of the memory cells in the resistive random access memory reach the $i^{th}$ preset value.

Figure 6:
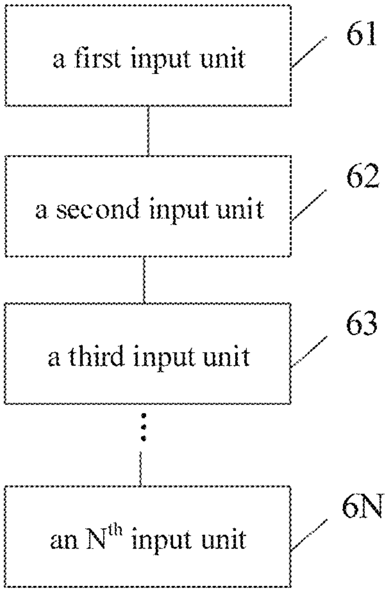
FIG. 6 is a structural diagram of an apparatus for initializing a resistive random access memory in an embodiment of the present application.

An embodiment of the present application further provides an apparatus for initializing a resistive random access memory, as shown in FIG. 6, which includes:

a first input unit 61, configured to input a plurality of pulses of a first voltage into a resistive random access memory until memory cells in the resistive random access memory transition from a high resistance state to a low resistance state;

a second input unit 62, configured to input a plurality of pulses of a second voltage into the resistive random access memory until resistance values of the memory cells in the resistive random access memory reach a second preset value; where the second preset value is less than resistance values of the memory cells when transitioning from the high resistance state to the low resistance state;

a third input unit 63, configured to input a plurality of pulses of a third voltage into the resistive random access memory until the resistance values of the memory cells in the resistive random access memory reach a third preset value; where the third preset value is less than the second preset value;

and so on, until an $N^{th}$ input unit 6N, which is configured to input a plurality of pulses of an $N^{th}$ voltage into the resistive random access memory until the resistance values of the memory cells in the resistive random access memory reach an $N^{th}$ preset value; where N is greater than or equal to 3, voltage values of the first voltage, the second voltage, the third voltage . . . and the $N^{th}$ voltage gradually decrease, the $N^{th}$ preset value is less than an $(N-1)^{th}$ preset value, and the $N^{th}$ preset value is a target resistance value achieved to complete an initialization of the memory cells;

where inputting a plurality of pulses of an $i^{th}$ voltage into the resistive random access memory until the resistance values of the memory cells in the resistive random access memory reach an $i^{th}$ preset value includes:

inputting the plurality of pulses of the $i^{th}$ voltage into the resistive random access memory; when a total number of the input pulses of the $i^{th}$ voltage is greater than a second preset threshold and a resistance change rate is less than a rate threshold, increasing the $i^{th}$ voltage, and inputting a plurality of pulses of the increased $i^{th}$ voltage into the resistive random access memory until the resistance values of the memory cells in the resistive random access memory reach the $i^{th}$ preset value; where i represents any of two, three . . . N−1, and N.

According to the apparatus for initializing the resistive random access memory provided in the embodiments of the present application, the resistive random access memory is first initialized by a plurality of pulses of a relatively high voltage, so that the memory cells in the resistive random access memory can quickly transition from a high resistance state to a low resistance state; then, after the memory cells in the resistive random access memory transition to the low resistance state, the resistance values of the memory cells are finely tuned in a plurality of phases, and the voltages of the pulses in each phase are the same, which can converge the initialized resistance state distribution and improve the consistency between cells in the array. Moreover, during each phase of fine-tuning, if the total number of pulses input in that phase is greater than the second preset threshold and the resistance change rate is less than the rate threshold, the voltage in that phase is increased, and a plurality of pulses of the increased voltage are input to the resistive random access memory until the resistance values of the memory cells in the resistive random access memory reach a target of that phase, which can further prevent some memory cells from being unable to obtain sufficient energy to complete initialization due to voltage division by transistors and voltage division related to physical addresses, and can also prevent the memory cells that are difficult to initialize from being unable to complete initialization due to insufficient energy, thereby greatly improving the success rate of initialization of the memory cells.

According to embodiments of the present application, the present application further provides an electronic device and a readable storage medium.

Figure 7:
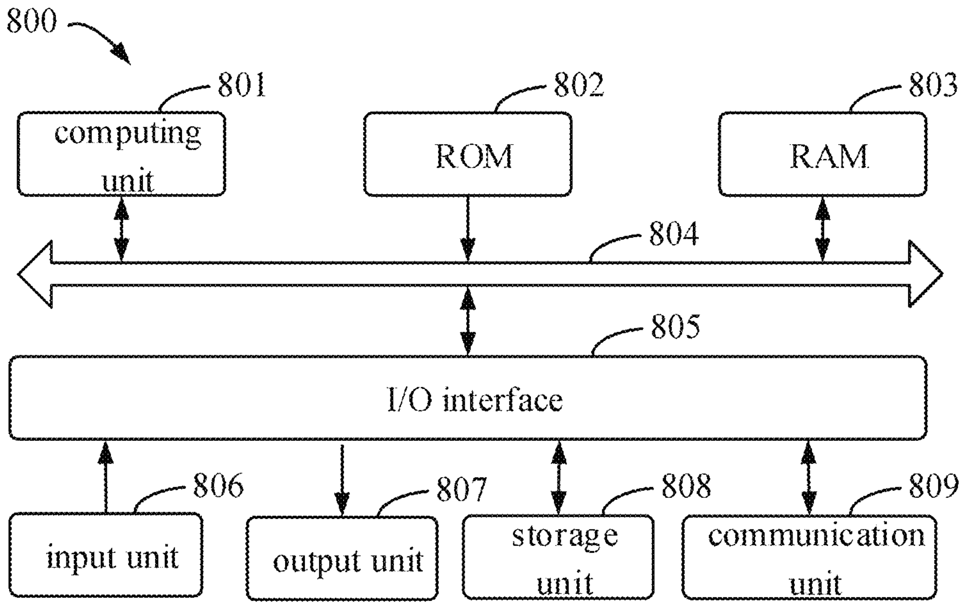
FIG. 7 is a schematic diagram of a hardware structure of an electronic device in an embodiment of the present application.

FIG. 7 illustrates a schematic block diagram of an exemplary electronic device 800 that can be used to implement the embodiments of the present application. The electronic device is intended to represent various forms of digital computers, such as a laptop computer, a desktop computer, a workstation, a personal digital assistant, a server, a blade server, a mainframe computer, and other suitable computers. The electronic device may further represent various forms of mobile apparatuses, such as a personal digital assistant, a cellular phone, a smart phone, a wearable device, and other similar computing apparatuses. The components shown herein, their connections and relationships and their functions are merely examples, and are not intended to limit the implementation of the present application described and/or required herein.

As shown in FIG. 7, the electronic device 800 includes a computing unit 801, which may perform various appropriate actions and processing according to a computer program stored in a read-only memory (ROM) 802 or a computer program loaded from a storage unit (memory cell) 808 to a random access memory (RAM) 803. The RAM 803 may further store various programs and data required for the operation of the electronic device 800. The computing unit 801, the ROM 802, and the RAM 803 are connected to each other through a bus 804. An input/output (I/O) interface 805 is also connected to the bus 804.

A plurality of components in the electronic device 800 are connected to the I/O interface 805, including: an input unit 806, such as a keyboard, a mouse and the like; an output unit 807, such as various types of displays, speakers and the like; the storage unit 808, such as a magnetic disk, an optical disk and the like; and a communication unit 809, such as a network card, a modem, a wireless communication transceiver and the like. The communication unit 809 allows the electronic device 800 to exchange information/data with other devices over a computer network such as the Internet and/or various telecommunication networks.

The computing unit 801 may be various general-purpose and/or special-purpose processing components with processing and computing capabilities. Some examples of the computing unit 801 include, but are not limited to, a central processing unit (CPU), a graphics processing unit (GPU), various dedicated artificial intelligence (AI) computing chips, various computing units that run machine learning model algorithms, a digital signal processor (DSP), and any appropriate processor, controller, microcontroller and the like. The computing unit 801 performs various methods and processing described above, such as the method for initializing a resistive random access memory. For example, in some embodiments, the method for initializing a resistive random access memory can be implemented as a computer software program, which is tangibly included in a machine-readable medium, such as the storage unit 808. In some embodiments, a part or all of the computer program may be loaded and/or installed onto the electronic device 800 via the ROM 802 and/or the communication unit 809. When the computer program is loaded onto the RAM 803 and executed by the computing unit 801, one or more steps of the method for initializing a resistive random access memory described above can be performed. Alternatively, in other embodiments, the computing unit 801 may be configured, by any other suitable means (for example, by means of firmware), to perform the method for initializing a resistive random access memory.

Various implementations of the systems and technologies described herein above can be implemented in a digital electronic circuit system, an integrated circuit system, a field programmable gate array (FPGA), an application-specific integrated circuit (ASIC), an application-specific standard product (ASSP), a system-on-chip (SOC) system, a complex programmable logical device (CPLD), computer hardware, firmware, software, and/or a combination thereof. The implementations may include: being implemented in one or more computer programs, the one or more computer programs may be executed and/or interpreted in a programmable system including at least one programmable processor, and the programmable processor may be a dedicated or general-purpose programmable processor, and may receive data and instructions from a storage system, at least one input apparatus, and at least one output apparatus, and transmit the data and instructions to the storage system, the at least one input apparatus, and the at least one output apparatus.

Program codes used to perform the method of the present application can be written in any combination of one or more programming languages. These program codes may be provided for a processor or a controller of a general-purpose computer, a special-purpose computer, or other programmable data processing apparatuses, such that when the program codes are executed by the processor or the controller, the functions/operations specified in the flowcharts and/or block diagrams are implemented. The program codes may be completely executed on a machine, or partially executed on a machine, or may be, as an independent software package, partially executed on a machine and partially executed on a remote machine, or completely executed on a remote machine or a server.

In the context of the present application, the machine-readable medium may be a tangible medium, which may include or store a program for use by an instruction execution system, apparatus or device, or for use in combination with the instruction execution system, apparatus or device. The machine-readable medium may be a machine-readable signal medium or a machine-readable storage medium. The machine-readable medium may include, but is not limited to, an electronic, magnetic, optical, electromagnetic, infrared, or semiconductor system, apparatus, or device, or any suitable combination thereof. More specific examples of the machine-readable storage medium may include an electrical connection based on one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination thereof.

To provide interaction with a user, the systems and technologies described herein may be implemented in a computer, the computer is provided with: a display apparatus (such as a cathode ray tube (CRT) or a liquid crystal display (LCD) monitor) used for displaying information to the user; and a keyboard and a pointing apparatus (such as a mouse or a trackball), and the user may provide input to the computer through the keyboard and the pointing apparatus. Other types of apparatuses may also be used for providing interaction with the user; for example, feedback provided to the user may be sensory feedback in any form (such as visual feedback, auditory feedback, or tactile feedback); and the input of the user may be received in any form (including vocal input, speech input, or tactile input).

The systems and technologies described herein may be implemented in a computing system (for example, as a data server) including a background component, or a computing system (for example, an application server) including a middleware component, or a computing system (for example, a user computer with a graphical user interface or a web browser through which the user may interact with the implementation manners of the systems and technologies described herein) including a front-end component, or a computing system including any combination of the background component, the middleware component, or the front-end component. The components of the system may be connected with each other through digital data communication (for example, a communication network) in any form or medium. Examples of the communication network include: a local area network (LAN), a wide area network (WAN), and the Internet.

The computer system may include a client and a server. The client and the server are generally far away from each other and usually interact through the communications network. A relationship between the client and the server is generated by computer programs running in respective computers and having a client-server relationship with each other. The server may be a cloud server, a server in a distributed system, or a server combined with a blockchain.

It should be understood that the steps may be reordered, added or deleted by using the flows in various forms, which are shown above. For example, the steps recorded in the present application may be performed concurrently, in order, or in a different order, provided that the desired results of the technical solutions disclosed in the present application can be achieved, which is not limited herein.

In addition, the terms "first" and "second" are merely used for a description purpose, and cannot be interpreted as indicating or implying relative importance or implicitly indicating the number of the technical features indicated. Therefore, the features defined by "first" and "second" can explicitly or implicitly include at least one of the features. In the description of the present application, "a plurality of" means two or more, unless otherwise specified.

The above merely describes specific embodiments of the present application, but the protection scope of the present application is not limited thereto. Any person skilled in the art can easily conceive modifications or replacements within the technical scope of the present application, and these modifications or replacements shall fall within the protection scope of the present application. Therefore, the protection scope of the present application shall be subject to the protection scope of the claims.

The invention claimed is:

1. A method for initializing a resistive random access memory, comprising:

inputting a plurality of pulses of a first voltage into the resistive random access memory until memory cells in the resistive random access memory transition from a high resistance state to a low resistance state;

inputting a plurality of pulses of a second voltage into the resistive random access memory until resistance values of the memory cells in the resistive random access memory reach a second preset value; wherein the second preset value is less than the resistance values of the memory cells when transitioning from the high resistance state to the low resistance state;

inputting a plurality of pulses of a third voltage into the resistive random access memory until the resistance values of the memory cells in the resistive random access memory reach a third preset value; wherein the third preset value is less than the second preset value;

and so on, inputting a plurality of pulses of an $N^{th}$ voltage into the resistive random access memory until the resistance values of the memory cells in the resistive random access memory reach an $N^{th}$ preset value; wherein N is greater than or equal to 3, voltage values of the first voltage, the second voltage, the third voltage . . . and the $N^{th}$ voltage gradually decrease, the $N^{th}$ preset value is less than an $(N-1)^{th}$ preset value, and the $N^{th}$ preset value is a target resistance value achieved to complete an initialization of the memory cells;

wherein inputting a plurality of pulses of an $i^{th}$ voltage into the resistive random access memory until the resistance values of the memory cells in the resistive random access memory reach an $i^{th}$ preset value comprises: inputting the plurality of pulses of the $i^{th}$ voltage into the resistive random access memory; when a total number of the input pulses of the $i^{th}$ voltage is greater than a second preset threshold and a resistance change rate is less than a rate threshold, increasing the $i^{th}$ voltage to obtain an increased $i^{th}$ voltage, and inputting a plurality of pulses of the increased $i^{th}$ voltage into the resistive random access memory until the resistance values of the memory cells in the resistive random access memory reach the $i^{th}$ preset value; wherein i represents any of two, three . . . N−1, and N.

2. The method according to claim 1, wherein the inputting the plurality of pulses of the first voltage into the resistive random access memory until the memory cells in the resistive random access memory transition from the high resistance state to the low resistance state comprises:

obtaining first electrical parameters of the memory cells in the resistive random access memory; wherein the first electrical parameters comprise at least one of first current values or first resistance values; and when it is determined based on the first electrical parameters that the memory cells in the resistive random access memory have not transitioned from the high resistance state to the low resistance state, inputting one pulse of the first voltage into the resistive random access memory; and then returning to the step of obtaining the first electrical parameters of the memory cells in the resistive random access memory until it is determined that the memory cells in the resistive random access memory have transitioned from the high resistance state to the low resistance state.

3. The method according to claim 2, wherein the inputting one pulse of the first voltage into the resistive random access memory when it is determined based on the first electrical parameters that the resistive random access memory have not transitioned from the high resistance state to the low resistance state comprises:

when a total number of the input pulses of the first voltage is less than a first preset threshold and it is determined based on the first electrical parameters that the memory cells in the resistive random access memory have not transitioned from the high resistance state to the low resistance state, inputting one pulse of the first voltage into the resistive random access memory.

4. The method according to claim 1, wherein the inputting the plurality of pulses of the $i^{th}$ voltage into the resistive random access memory comprises:

obtaining $i^{th}$ electrical parameters of the memory cells in the resistive random access memory; wherein the $i^{th}$ electrical parameters comprising at least one of $i^{th}$ current values or $i^{th}$ resistance values; and when it is determined based on the $i^{th}$ electrical parameters that the resistance values of the memory cells in the resistive random access memory do not reach the $i^{th}$ preset value, inputting one pulse of the $i^{th}$ voltage into the resistive random access memory; and then returning to the step of obtaining the $i^{th}$ electrical parameters of the memory cells in the resistive random access memory.

5. The method according to claim 4, wherein the inputting one pulse of the $i^{th}$ voltage into the resistive random access memory when it is determined based on the $i^{th}$ electrical parameters that the resistance values of the memory cells in the resistive random access memory do not reach the $i^{th}$ preset value comprises:

when the total number of the input pulses of the $i^{th}$ voltage is less than the second preset threshold, a total number of the input pulses is less than a third preset threshold, and it is determined based on the $i^{th}$ electrical parameters that the resistance values of the memory cells in the resistive random access memory do not reach the $i^{th}$ preset value, inputting one pulse of the $i^{th}$ voltage into the resistive random access memory.

6. The method according to claim 1, wherein when the total number of the input pulses of the $i^{th}$ voltage is greater than the second preset threshold and the resistance change rate is less than the rate threshold, the increasing the $i^{th}$ voltage and inputting the plurality of pulses of the increased $i^{th}$ voltage into the resistive random access memory until the resistance values of the memory cells in the resistive random access memory reach the $i^{th}$ preset value comprises:

when the total number of the input pulses of the $i^{th}$ voltage is greater than the second preset threshold, a total number of the input pulses is less than a third preset threshold, and the resistance change rate is less than the rate threshold, inputting the plurality of pulses of the increased $i^{th}$ voltage into the resistive random access memory until the resistance values of the memory cells in the resistive random access memory reach the $i^{th}$ preset value.

7. The method according to claim 1, wherein a formula for calculating the resistance change rate is as follows:

$$\frac{(I_2 - I_1)}{V} = \Delta\sigma,$$

wherein $\Delta\sigma$ represents the resistance change rate, $I_2$ represents a current value when the total number of the input pulses of the $i^{th}$ voltage is the second preset threshold, $I_1$ represents a current value when the total number of the input pulses of the $i^{th}$ voltage is 1, and V represents a voltage value of the $i^{th}$ voltage.

8. An electronic device, comprising:

at least one processor; and a memory in communication connection with the at least one processor;

wherein the memory stores instructions executable by the at least one processor, and the instructions are executed by the at least one processor to cause the at least one processor to execute the method according to claim 1.

9. A non-transitory computer-readable storage medium, wherein computer instructions are stored in the non-transitory computer-readable storage medium and configured to, when executed by a computer, cause the computer to perform the method according to claim 1.

10. An apparatus for initializing a resistive random access memory, comprising:

a first input unit, configured to input a plurality of pulses of a first voltage into the resistive random access memory until memory cells in the resistive random access memory transition from a high resistance state to a low resistance state;

a second input unit, configured to input a plurality of pulses of a second voltage into the resistive random access memory until resistance values of the memory cells in the resistive random access memory reach a second preset value; wherein the second preset value is less than the resistance values of the memory cells when transitioning from the high resistance state to the low resistance state;

a third input unit, configured to input a plurality of pulses of a third voltage into the resistive random access memory until the resistance values of the memory cells in the resistive random access memory reach a third preset value; wherein the third preset value is less than the second preset value;

and so on, until an $N^{th}$ input unit, configured to input a plurality of pulses of an $N^{th}$ voltage into the resistive random access memory until the resistance values of the memory cells in the resistive random access memory reach an $N^{th}$ preset value; wherein N is greater than or equal to 3, voltage values of the first voltage, the second voltage, the third voltage . . . and the $N^{th}$ voltage gradually decrease, the $N^{th}$ preset value is less than an $(N-1)^{th}$ preset value, and the $N^{th}$ preset value is a target resistance value achieved to complete an initialization of the memory cells;

wherein inputting a plurality of pulses of an $i^{th}$ voltage into the resistive random access memory until the resistance values of the memory cells in the resistive random access memory reach an $i^{th}$ preset value comprises: inputting the plurality of pulses of the $i^{th}$ voltage into the resistive random access memory; when a total number of the input pulses of the $i^{th}$ voltage is greater than a second preset threshold and a resistance change rate is less than a rate threshold, increasing the $i^{th}$ voltage to obtain an increased $i^{th}$ voltage, and inputting a plurality of pulses of the increased $i^{th}$ voltage into the resistive random access memory until the resistance values of the memory cells in the resistive random access memory reach the $i^{th}$ preset value; wherein i represents any of two, three . . . N−1, and N.

* * * * *